United States Patent
Ito et al.

(10) Patent No.: US 9,196,784 B2
(45) Date of Patent: Nov. 24, 2015

(54) SEMICONDUCTOR DEVICE AND METHOD FOR MANUFACTURING SEMICONDUCTOR DEVICE

(71) Applicant: Kabushiki Kaisha Toshiba, Minato-ku (JP)

(72) Inventors: Toshihide Ito, Minato (JP); Jumpei Tajima, Koganei (JP); Hiroshi Katsuno, Komatsu (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/459,602

(22) Filed: Aug. 14, 2014

(65) Prior Publication Data

US 2015/0060763 A1    Mar. 5, 2015

(30) Foreign Application Priority Data

Sep. 3, 2013   (JP) .................................. 2013-182597

(51) Int. Cl.
*H01L 33/00* (2010.01)
*H01L 33/32* (2010.01)
*H01L 33/40* (2010.01)

(52) U.S. Cl.
CPC ............ *H01L 33/0095* (2013.01); *H01L 33/32* (2013.01); *H01L 33/40* (2013.01); *H01L 2933/0016* (2013.01)

(58) Field of Classification Search
None
See application file for complete search history.

(56) References Cited

U.S. PATENT DOCUMENTS

| 7,034,330 B2 | 4/2006 | Udagawa |
| 2004/0012032 A1 | 1/2004 | Toda et al. |

FOREIGN PATENT DOCUMENTS

| JP | 10-27783 | 1/1998 |
| JP | 2004-146424 | 5/2004 |
| JP | 2006-66556 | 3/2006 |
| JP | 2007-36266 | 2/2007 |
| JP | 2012-28812 | 2/2012 |

*Primary Examiner* — Scott B Geyer
(74) *Attorney, Agent, or Firm* — Oblon, McClelland, Maier & Neustadt, L.L.P.

(57) ABSTRACT

According to one embodiment, a semiconductor device includes an n-type semiconductor layer and a first metal layer. The n-type semiconductor layer includes a nitride semiconductor. The n-type semiconductor layer includes a boron-containing region including boron bonded to oxygen. The first metal layer contacts the boron-containing region.

20 Claims, 11 Drawing Sheets

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2013-182597, filed on Sep. 3, 2013; the entire contents of which are incorporated herein by reference.

FIELD

Embodiments described herein relate generally to a semiconductor device and a method for manufacturing the semiconductor device.

BACKGROUND

It is necessary to reduce the operating voltage of semiconductor devices such as switching elements, semiconductor light emitting elements such as LEDs (Light Emitting Diodes), etc.

DETAILED DESCRIPTION

Figure 1:
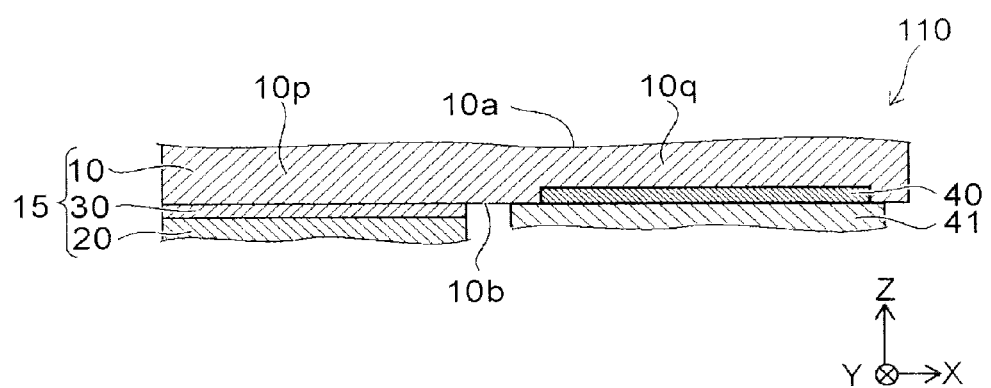
FIG. 1 is a schematic view showing the semiconductor device according to the first embodiment.

According to one embodiment, a semiconductor device includes an n-type semiconductor layer and a first metal layer. The n-type semiconductor layer includes a nitride semiconductor. The n-type semiconductor layer includes a boron-containing region including boron bonded to oxygen. The first metal layer contacts the boron-containing region.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

A first embodiment relates to a semiconductor device.

The semiconductor device includes, for example, a semiconductor light emitting element, a semiconductor light receiving element, an electronic device, etc. The semiconductor light emitting element includes, for example, a light emitting diode (LED), a laser diode (LD), etc. The semiconductor light receiving element includes a photodiode (PD), etc. The electronic device includes, for example, a high electron mobility transistor (HEMT), a heterojunction bipolar transistor (HBT), a field effect transistor (FET), a Schottky barrier diode (SBD), etc.

FIG. 1 is a schematic view illustrating the semiconductor device according to the first embodiment.

FIG. 1 is a schematic cross-sectional view of the semiconductor device 110 according to the first embodiment.

As shown in FIG. 1, the semiconductor device 110 includes an n-type semiconductor layer 10 and a first metal layer 41.

The n-type semiconductor layer 10 includes a nitride semiconductor. The n-type semiconductor layer 10 includes, for example, a GaN layer including an n-type impurity. The n-type impurity may include at least one selected from Si, Ge, Te, and Sn. The n-type semiconductor layer 10 includes, for example, an n-side contact layer.

The n-type semiconductor layer 10 has, for example, a first major surface 10a and a second major surface 10b. The second major surface 10b is, for example, the surface on the first metal layer 41 side. The first major surface 10a is the surface on the side opposite to the second major surface 10b.

The n-type semiconductor layer 10 includes a boron-containing region 40. In the example, the boron-containing region 40 includes a portion of the second major surface 10b of the n-type semiconductor layer 10. The boron-containing region 40 includes boron (B) bonded to oxygen (O). The boron-containing region 40 includes, for example, $B_2O_3$. The boron-containing region 40 includes, for example, $BO_x$ (x<1.5).

The first metal layer 41 is provided to contact the boron-containing region 40. In the example, the first metal layer 41 is disposed on the second major surface 10b side of the n-type semiconductor layer 10. The first metal layer 41 is electrically connected to, for example, the n-type semiconductor layer 10. The first metal layer 41 may include, for example, Al. The first metal layer 41 may include Ti, Zn, or Ag. The first metal layer 41 may include In, Zr, or Hf.

For example, the boron-containing region 40 reduces the contact resistance between the n-type semiconductor layer 10 and the first metal layer 41. The operating voltage of the semiconductor device 110 is reduced. Examples of such characteristics are described below.

The direction from the first metal layer 41 toward the n-type semiconductor layer 10 is taken as a Z-axis direction (a stacking direction). One direction perpendicular to the Z-axis direction is taken as an X-axis direction. A direction perpendicular to the Z-axis direction and the X-axis direction is taken as a Y-axis direction.

In the specification of the application, being "stacked" includes not only the state of overlapping in contact with each other but also the state of overlapping with another layer inserted therebetween.

In the example, the semiconductor device 110 further includes a p-type semiconductor layer 20 and a light emitting layer 30. The light emitting layer 30 is provided between the p-type semiconductor layer 20 and the n-type semiconductor layer 10. The p-type semiconductor layer 20 and the light emitting layer 30 include, for example, nitride semiconductors. In the example, a stacked body 15 includes the n-type semiconductor layer 10, the light emitting layer 30, and the p-type semiconductor layer 20.

In the example, the semiconductor device 110 is a semiconductor light emitting element.

The p-type semiconductor layer 20 includes, for example, a GaN layer including a p-type impurity. The p-type impurity may include at least one selected from Mg, Zn, and C. The p-type semiconductor layer 20 includes, for example, a p-side contact layer.

The light emitting layer 30 is described below in detail. As shown in FIG. 1, the n-type semiconductor layer 10 includes, for example, a first portion 10$p$ and a second portion 10$q$. The second portion 10$q$ is arranged with the first portion 10$p$ in a direction intersecting the Z-axis direction. The p-type semiconductor layer 20 is separated from the first portion 10$p$ in the Z-axis direction. The light emitting layer 30 is disposed between the first portion 10$p$ and the p-type semiconductor layer 20.

A low operating voltage is obtained by such a configuration. Hereinbelow, experiments that were used as the basis for constructing the configuration of the semiconductor device according to the embodiment will be described. First, an example of the method for manufacturing the semiconductor device will be described. Here, an example will be described in which a semiconductor light emitting element is used as the semiconductor device.

FIG. 2A to FIG. 2D are schematic cross-sectional views in order of the processes, illustrating the method for manufacturing the semiconductor device according to the first embodiment.

Figure 2A:
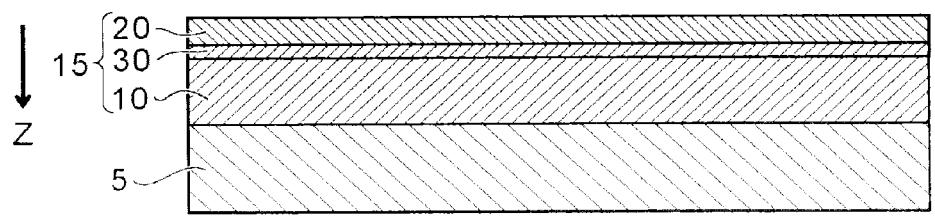
FIG. 2A to FIG. 2D are schematic cross-sectional views in order of the processes, showing the method for manufacturing the semiconductor device according to the first embodiment.

As shown in FIG. 2A, a stacked body film that is used to form the stacked body 15 is formed on a growth substrate 5. For example, an n-type semiconductor film that is used to form the n-type semiconductor layer 10, a light emitting film that is used to form the light emitting layer 30, and a p-type semiconductor film that is used to form the p-type semiconductor layer 20 are formed in this order on the growth substrate 5.

The growth substrate 5 may include one selected from, for example, silicon, sapphire, GaN, and SiC. The n-type semiconductor film (the n-type semiconductor layer 10) may include, for example, GaN including Si. The Si concentration of the n-type semiconductor film is, for example, not less than $1 \times 10^{17}$ (1/cm$^3$) and not more than $5 \times 10^{19}$ (1/cm$^3$).

Figure 2B:
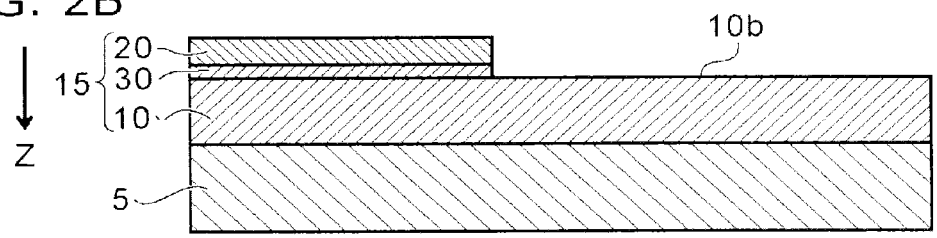

As shown in FIG. 2B, a portion of the p-type semiconductor film and a portion of the light emitting film are removed by, for example, etching, etc. A portion of the n-type semiconductor film (a portion of the second major surface 10$b$) is exposed. Thereby, the p-type semiconductor layer 20, the light emitting layer 30, and the n-type semiconductor layer 10 are formed.

Figure 2C:
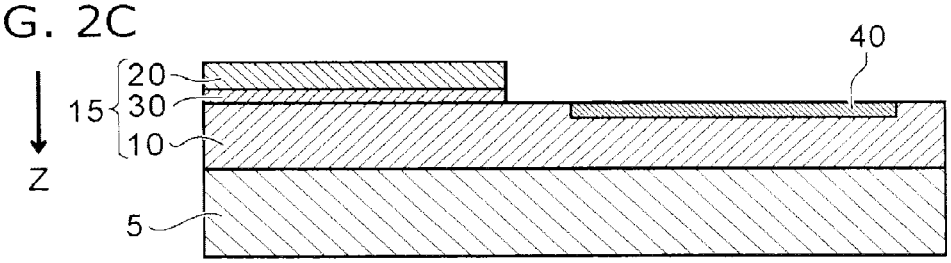

As shown in FIG. 2C, plasma processing of the exposed portion of the n-type semiconductor layer 10 is performed in an atmosphere including BCl$_3$ gas. Thereby, the boron-containing region 40 is formed. The plasma processing is described below in detail.

It is favorable for cleaning to be performed after implementing the plasma processing. For example, a cleansing agent including oxygen may be used in the cleaning. For example, a liquid may be used in the cleaning. It is favorable for, for example, the physical damage of the boron-containing region 40 to be less for cleaning with a liquid than for cleaning using the gas of the plasma processing or the like. The cleansing agent may include, for example, water.

The cleansing agent may include, for example, at least one selected from an organic solvent and an acid. For example, acetone, ethanol, etc., may be used as the organic solvent. For example, sulfuric acid-hydrogen peroxide, hydrofluoric acid, hydrochloric acid, etc., may be used as the acid.

The cleaning time is, for example, 5 minutes or more. In the case where the cleaning time is less than 5 minutes, the chlorine concentration at the boron-containing region 40 becomes high; and the adhesion with the first metal layer 41 described below degrades.

Figure 2D:
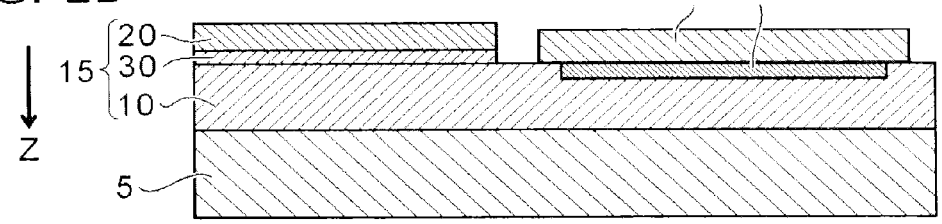

As shown in FIG. 2D, a first metal film that is used to form the first metal layer 41 is formed, for example, on the boron-containing region 40 and on a portion of the n-type semiconductor layer 10. The first metal film may include, for example, an Al film. The thickness of the Al film is, for example, about 200 nm.

The formation of the first metal film (the first metal layer 41) may include, for example, vacuum vapor deposition. The first metal film (the first metal layer 41) is patterned in a prescribed configuration by, for example, lift-off using a resist, etc. For example, vapor deposition using a mask having openings, etc., may be used. Thereby, the first metal layer 41 is formed. The length of the first metal layer 41 along a direction perpendicular to the stacking direction (the width of the first metal layer 41) is, for example, about 20 μm.

In the example, heat treatment is implemented after forming the first metal layer 41. The heat treatment is performed, for example, in an inert gas atmosphere or in a vacuum (at reduced pressure). The heat treatment is implemented, for example, inside an atmosphere including at least one selected from nitrogen and argon. The temperature of the heat treatment is, for example, not less than 300° C. and not more than 900° C. It is favorable for the temperature to be not less than 400° C. and not more than 600° C. The time of the heat treatment is, for example, not less than 30 seconds and not more than 5 minutes, e.g., 1 minute. Thereby, the semiconductor device 111 is formed.

For example, the Al of the first metal layer 41 and the GaN of the n-type semiconductor layer 10 are alloyed by the heat treatment. A low contact resistance can be obtained. There are cases where a sufficiently low contact resistance is not obtained when the heat treatment temperature is less than 300° C. There are cases where the first metal layer 41 degrades when the heat treatment temperature exceeds 900° C.

In the semiconductor device 111, a current is supplied to the light emitting layer 30 via the n-type semiconductor layer 10 and the p-type semiconductor layer 20 when a voltage is applied between the first metal layer 41 and the p-type semiconductor layer 20. Light is emitted from the light emitting layer 30.

An example of the plasma processing will now be described.

Figure 3A:
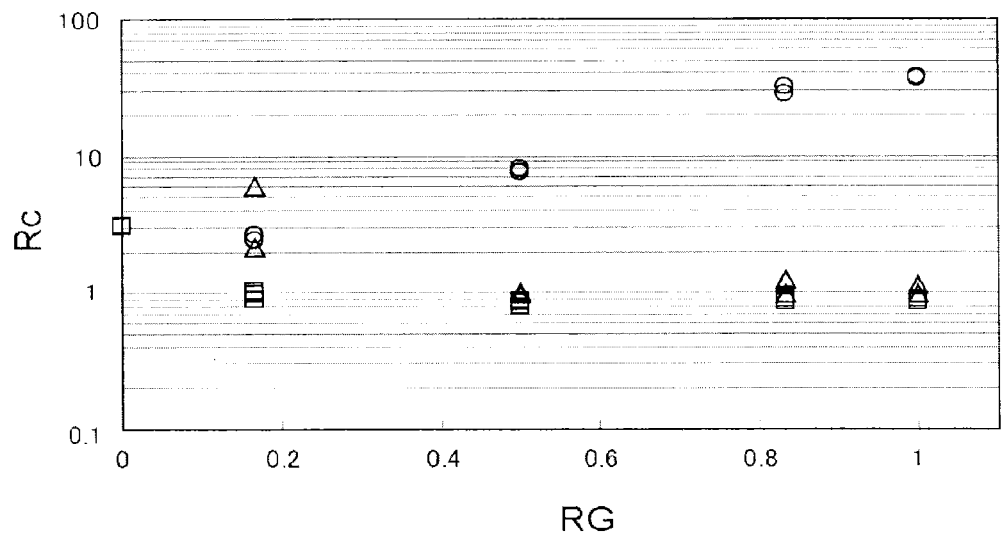
FIG. 3A and FIG. 3B are graphs showing characteristics of the semiconductor device.
Figure 3B:
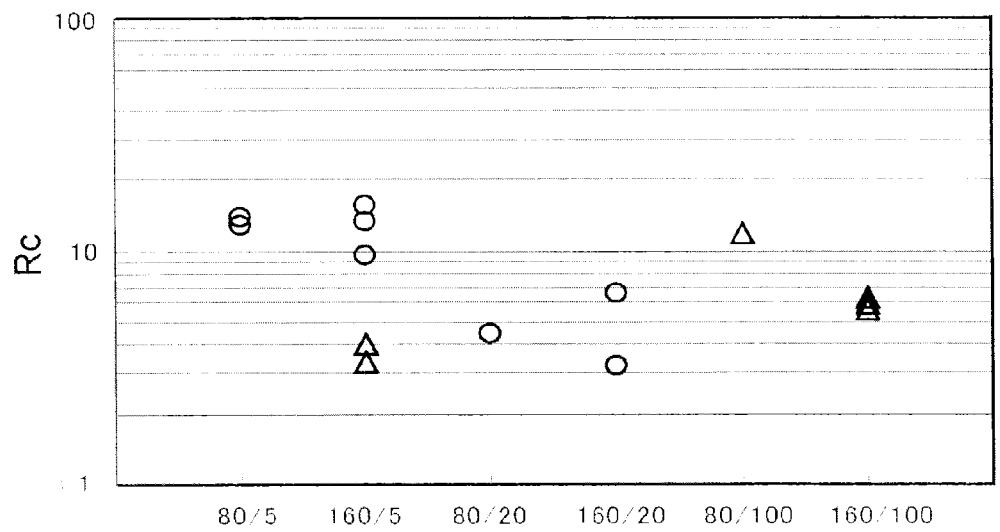

FIG. 3A and FIG. 3B are graphs illustrating characteristics of the semiconductor device.

These figures illustrate characteristics when the plasma processing is performed using an inductively coupled plasma reactive ion etching apparatus.

In FIG. 3A, the horizontal axis is a flow rate ratio RG of the $BCl_3$ gas. The flow rate ratio RG of the $BCl_3$ gas is the ratio of the flow rate ($BCl_3$) of the $BCl_3$ gas to the flow rate ($BCl_3$+Ar) of the entire gas that is introduced. The flow rate ratio RG is represented by $BCl_3/(BCl_3 +Ar)$. At conditions where the flow rate ratio RG of the $BCl_3$ gas is 0, the $BCl_3$ gas is not introduced; and only the Ar gas is introduced. In FIG. 3A, the vertical axis is a contact resistance Rc (a relative value). For the sample shown in FIG. 3A, the antenna power is 160 W; the bias power is 5 W; the pressure is 0.5 Pa (pascals); and the processing time is 30 seconds.

In FIG. 3B, the horizontal axis is the conditions of the plasma processing, where the label "A/B" is the antenna power A (W)/bias power B (W). For example, when the label of the horizontal axis is "80/5," the antenna power A (W) is 80 W; and the bias power B is 5 W. In FIG. 3B, the vertical axis is the contact resistance Rc (a relative value). For the sample shown in FIG. 3B, the flow rate ratio RG of the $BCl_3$ gas is 0.5; the pressure is 0.5 Pa; and the processing time is 30 seconds.

In these figures, the round symbols correspond to the sample without sintering (after film formation but before sintering). The triangular symbols correspond to the sample after sintering at 400° C. The square symbols correspond to the sample after sintering at 600° C.

As illustrated in FIG. 3A, when the flow rate ratio RG is 0, the contact resistance Rc is too high to be estimated for the sample without sintering and the sample after sintering at 400° C. Therefore, the contact resistance Rc is not shown for the samples having such conditions.

For the sample without RIE processing, the contact resistance Rc (a relative value) of the sample without sintering is about 1. For the sample without RIE processing, the contact resistance Rc (a relative value) of the sample after sintering at 400° C. is about 10. For the sample without RIE processing, the contact resistance Rc (a relative value) of the sample after sintering at 600° C. is about 1.7.

As shown in FIG. 3A, after sintering at 400° C. or 600° C., the contact resistance Rc is high when the ratio (the flow rate ratio RG) of the flow rate of the $BCl_3$ gas to the flow rate of the Ar gas is lower than 0.2. It is considered that when the flow rate ratio RG is low, the effects of the $BCl_3$ gas are small; for example, the physical etching due to the Ar becomes dominant; and the contact resistance Rc (after sintering) becomes high.

As shown in FIG. 3B, the contact resistance Rc (after sintering) is high when the bias power is high, i.e., 100 W. It is considered that the boron-containing region 40 does not form easily when the bias power is high. It is considered that when the bias power is high, for example, the etching of the n-type semiconductor layer 10 becomes dominant; the boron-containing region 40 does not form easily; and as a result, the contact resistance Rc becomes high.

The supplied energy per unit time of plasma processing according to the embodiment is less than, for example, the supplied energy per unit time of plasma processing in the case where the etching is performed by plasma processing. The plasma processing time according to the embodiment is shorter than, for example, the plasma processing time in the case where the etching is performed by plasma processing. According to the embodiment, the processing time of the plasma processing is, for example, 1 minute or less. According to the embodiment, the bias power of the plasma processing is less than, for example, the bias power in the case where the etching is performed by plasma processing. In the semiconductor device according to the embodiment, the plasma processing does not pattern (e.g., etch) the n-type semiconductor layer 10.

Examples of the semiconductor devices 111a to 111e made by changing the conditions of the plasma processing will now be described.

In the semiconductor device 111a, the plasma processing is implemented in a mixed gas atmosphere of $BCl_3$ and Ar using an inductively coupled plasma reactive ion etching apparatus. The plasma processing time is, for example, 30 seconds. The flow rate of the $BCl_3$ gas is, for example, not less than 5 sccm and not more than 100 sccm. The flow rate of the Ar gas is, for example, not less than 5 sccm and not more than 30 sccm. The ratio (the flow rate ratio RG) of the flow rate of the $BCl_3$ gas to the flow rate of the Ar gas is 0.2 or more. The antenna power is, for example, not less than 50 W and not more than 200 W. The bias power is, for example, not less than 5 W but less than 100 W.

Otherwise, the conditions of the semiconductor device 111a are the same as those of the semiconductor device 111.

In the semiconductor device 111b, the plasma processing is implemented in a mixed gas atmosphere of $BCl_3$ and $Cl_2$. The flow rate of the $Cl_2$ gas is, for example, not less than 5 sccm and not more than 30 sccm. In the semiconductor device 111c, the plasma processing is implemented in a $BCl_3$ gas atmosphere. In the semiconductor device 111d, the plasma processing is implemented in a mixed gas atmosphere of $BCl_3$ and $O_2$. The flow rate of the $O_2$ gas is, for example, not less than 5 sccm and not more than 30 sccm. In the semiconductor device 111e, the plasma processing is implemented in a mixed gas atmosphere of $BCl_3$ and $N_2$. The flow rate of the $N_2$ gas is, for example, not less than 5 sccm and not more than 30 sccm. Otherwise, the conditions of the semiconductor devices 111b to 111e are the same as those of the semiconductor device 111a.

As described below, the boron-containing region 40 is formed by this plasma processing.

Figure 4A:
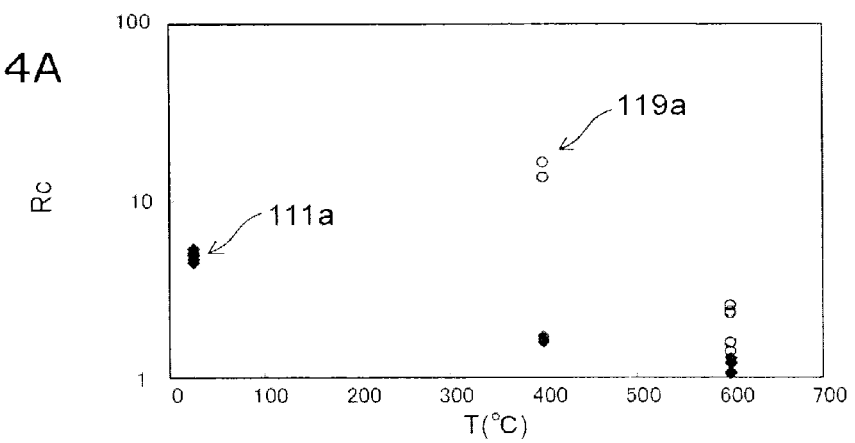
FIG. 4A to FIG. 4C are graphs showing characteristics of the semiconductor device.
Figure 4B:
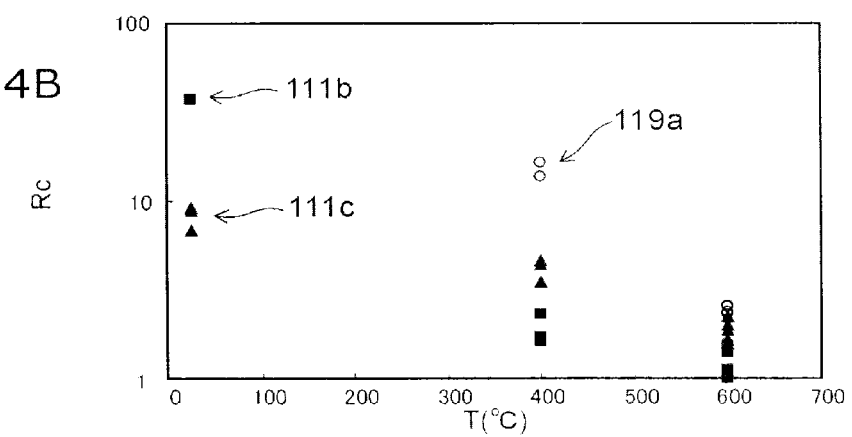
Figure 4C:
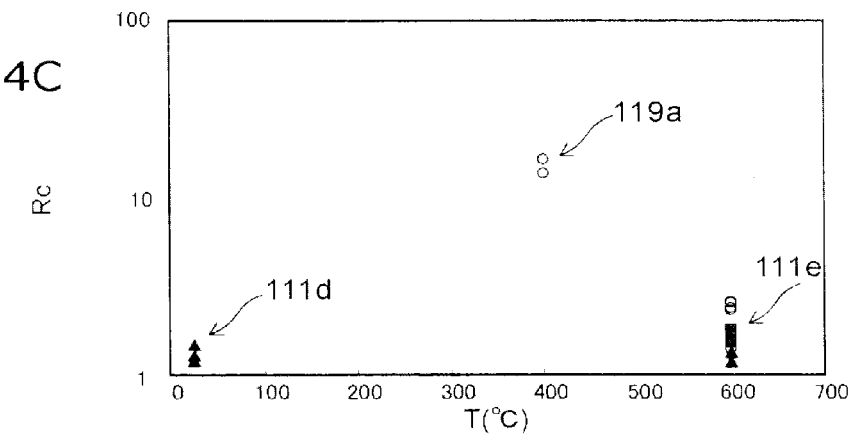

FIG. 4A to FIG. 4C are graphs illustrating characteristics of the semiconductor device.

FIG. 4A to FIG. 4C shows examples of the contact resistance Rc for the semiconductor devices 111a to 111e when the heat treatment temperature is changed. These figures also show an example of the semiconductor device 119a of a reference example for which plasma processing is not implemented. The semiconductor device 119a does not include the boron-containing region 40.

In FIG. 4A to FIG. 4C, the horizontal axis is a heat treatment temperature T (° C.). The vertical axis is the contact resistance Rc (a relative value).

As shown in FIG. 4A to FIG. 4C, the contact resistances Rc of the semiconductor devices 111a to 111e are lower than the contact resistance Rc of the semiconductor device 119a. The contact resistances Rc of the semiconductor devices 111a and 111b are about half of the contact resistance Rc of the semiconductor device 119a. The contact resistance Rc is the lowest for the semiconductor device 111a in which the plasma processing is implemented in the mixed gas atmosphere of $BCl_3$ and Ar.

Also, the contact resistance Rc is reduced further by the heat treatment. The operating voltage is low in the semiconductor devices 111a to 111e.

In the semiconductor device 111a, the cleaning is implemented after performing the plasma processing in the mixed gas atmosphere of $BCl_3$ and Ar. For example, a cleansing agent including oxygen is used in the cleaning. For example, water rinsing is implemented as the cleaning. Other than the cleaning not being performed, the conditions of the semiconductor device 111f are similar to those of the semiconductor device 111a.

In the semiconductor device 119b, the plasma processing of the n-type semiconductor layer 10 is implemented at the following conditions. This plasma processing is implemented in a mixed gas atmosphere of $BCl_3$ and Ar using a parallel plate plasma reactive ion etching apparatus. The plasma processing time is, for example, 160 minutes. The bias power is, for example, 400 W. Thereby, a portion of the n-type semiconductor layer 10 is etched.

The plasma processing of the semiconductor device according to the embodiment is gradual compared to the plasma processing conditions of the semiconductor device 119b.

Further, in the semiconductor device 119b, plasma processing in, for example, an Ar atmosphere is implemented as the cleaning. Thereby, the semiconductor device 119b is formed.

Other than plasma processing in an oxygen atmosphere being performed as the cleaning, the conditions of the semiconductor device 119c are similar to those of the semiconductor device 119b.

FIG. 5A to FIG. 5D are spectrographs of the semiconductor devices.

FIG. 6A to FIG. 6D are spectrographs of the semiconductor devices.

FIG. 7A to FIG. 7D are spectrographs of the semiconductor devices.

These figures are X-ray photoelectron spectroscopy of the boron-containing region. FIG. 5A to FIG. 5D show the peaks of boron (B) and chlorine (Cl). FIG. 6A to FIG. 6D show the peaks of silicon (Si). FIG. 7A to FIG. 7D show the peaks of oxygen (O). In these figures, the vertical axis is the detection amount (count (c/s)). The horizontal axis is a binding energy Eb (eV).

Figure 5A:
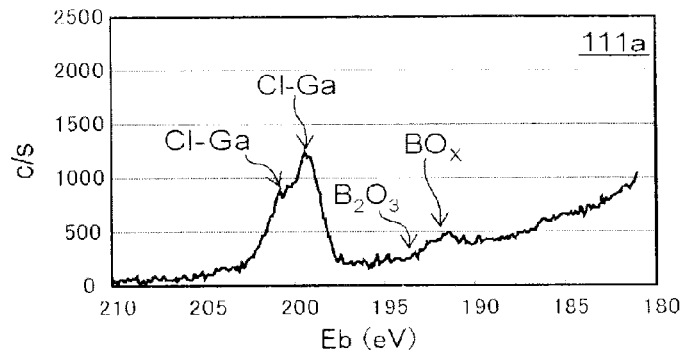
FIG. 5A to FIG. 5D are spectrographs of the semiconductor devices.
Figure 5B:
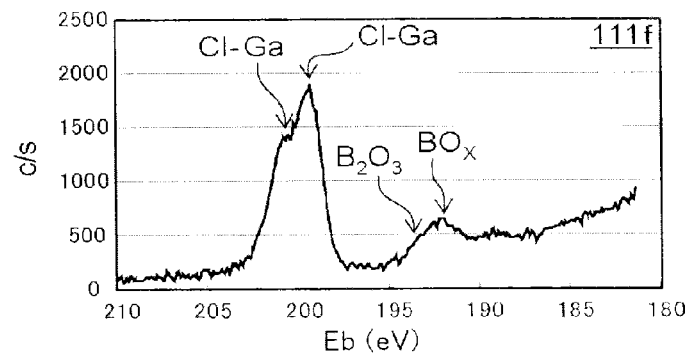
Figure 5C:
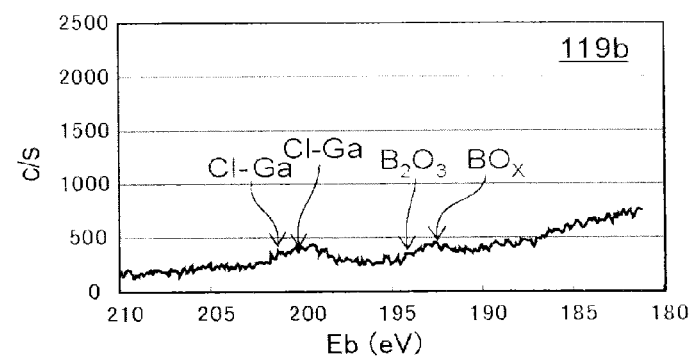
Figure 5D:
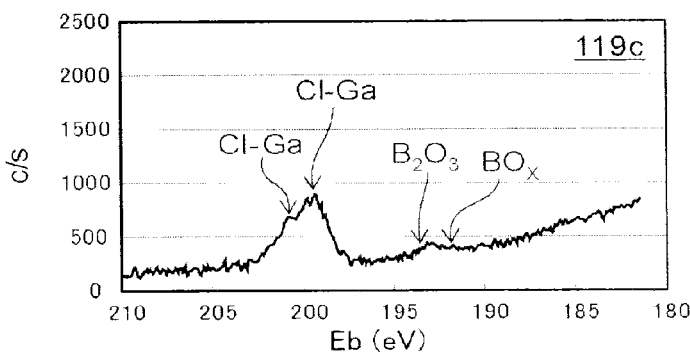
Figure 6A:
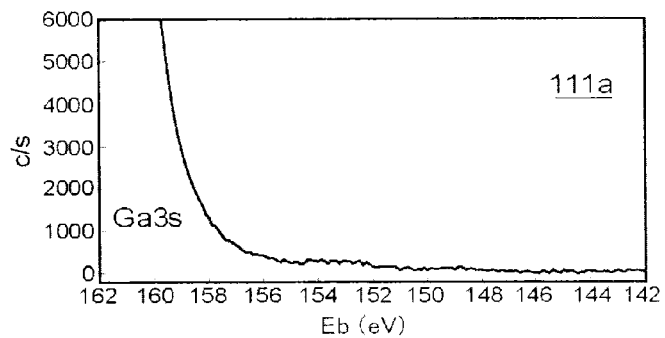
FIG. 6A to FIG. 6D are spectrographs of the semiconductor devices.
Figure 6B:
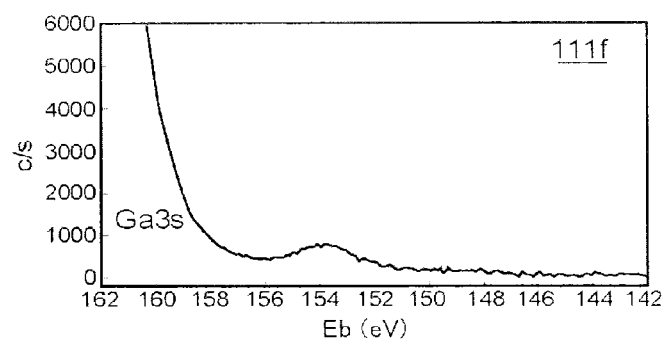
Figure 6C:
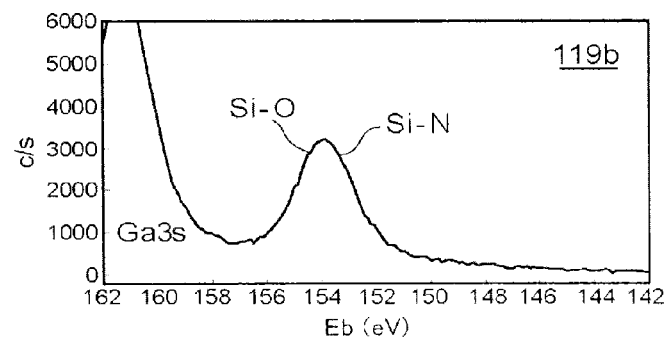
Figure 6D:
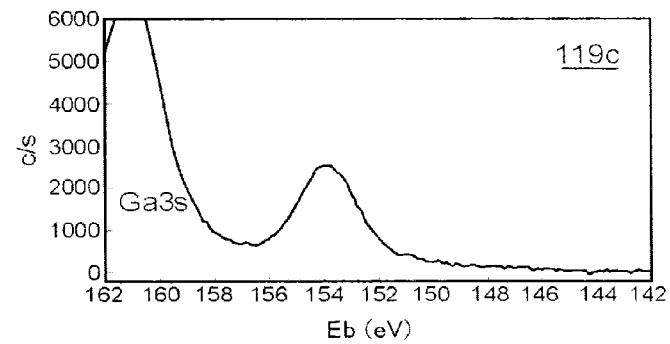
Figure 7A:
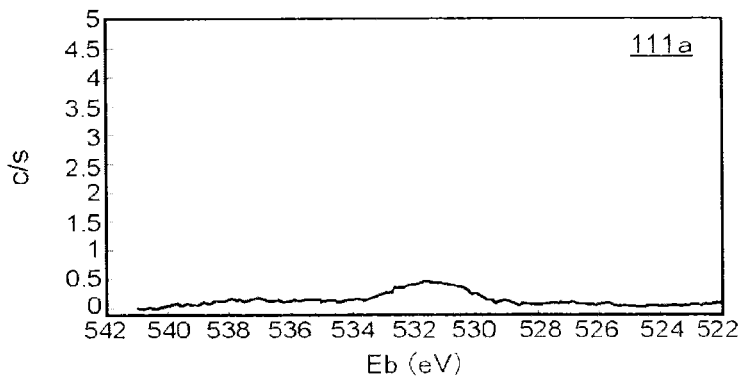
FIG. 7A to FIG. 7D are spectrographs of the semiconductor devices.
Figure 7B:
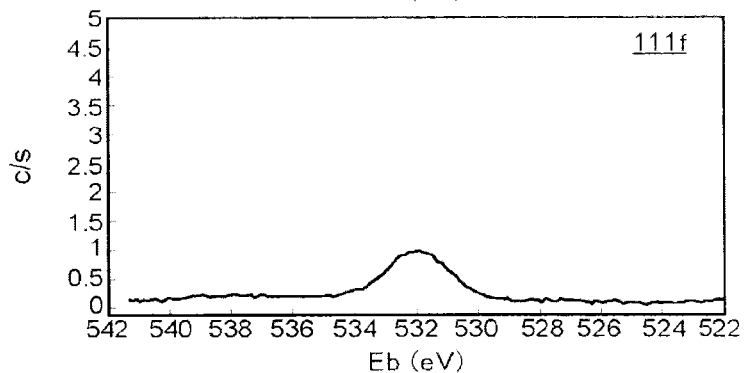
Figure 7C:
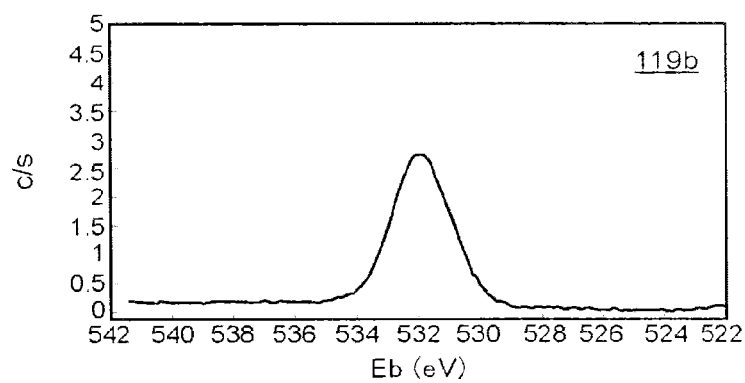
Figure 7D:
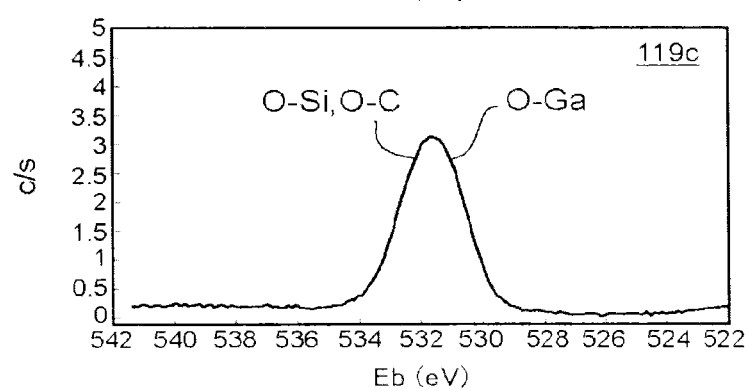

FIG. 5A, FIG. 6A, and FIG. 7A correspond to the semiconductor device 111a. FIG. 5B, FIG. 6B, and FIG. 7B correspond to the semiconductor device 111f. FIG. 5C, FIG. 6C, and FIG. 7C correspond to the semiconductor device 119b of the reference example. FIG. 5D, FIG. 6D, and FIG. 7D correspond to the semiconductor device 119c of the reference example.

As shown in FIG. 5A and FIG. 5B, peaks corresponding to $B_2O_3$ and $BO_x$ are confirmed for the semiconductor devices 111a and 111f according to the embodiment. In other words, in the semiconductor devices 111a and 111f according to the embodiment, boron exists in the boron-containing region 40 in a state of boron oxide bonded to oxygen.

Conversely, in the semiconductor devices 119b and 119c of the reference examples as shown in FIG. 5C and FIG. 5D, the peaks corresponding to $B_2O_3$ and $BO_x$ are extremely small. In other words, the semiconductor devices 119b and 119c substantially do not include boron oxide bonded to oxygen. The boron-containing region 40 substantially is not formed in the semiconductor devices 119b and 119c.

In the embodiment, the boron concentration included in the boron-containing region 40 is, for example, 0.4 atomic % or more. It is favorable for the boron concentration to be 0.5 atomic % or more, or 0.6 atomic % or more.

In the semiconductor device 111a, the boron concentration is, for example, 0.62 atomic %. In the semiconductor device 111f, the boron concentration is, for example, 1.79 atomic %.

In the semiconductor device 119b, the boron concentration is, for example, 0.36 atomic %. In the semiconductor device 119c, the boron concentration is, for example, 0.34 atomic %.

The contact resistance Rc is low when the boron concentration is 0.4 atomic % or more. When the boron concentration is 0.5 atomic % or more, for example, it is possible to suppress the local fluctuation of the boron concentration and reduce the contact resistance with good reproducibility. When the boron concentration is 0.6 atomic % or more, it is possible also to suppress the diffusion of the main element from the boron-containing region 40 into the first metal layer 41 and increase the reliability of the device.

The thickness of the boron-containing region 40 along the stacking direction from the first metal layer 41 toward the n-type semiconductor layer 10 is, for example, not less than 0.1 nanometers and not more than 10 nanometers. Here, the thickness of the boron-containing region 40 is, for example, the thickness of the continuous region where the boron concentration is 0.4 atomic % or more. The thickness of the boron-containing region 40 is, for example, the thickness of the continuous region where the boron concentration is not less than 1/e of the maximum value of the boron concentration of the boron-containing region 40. Herein, "e" is the base of the natural logarithm.

In the case where the thickness of the boron-containing region 40 is less than 0.1 nanometers, for example, the contact resistance Rc does not decrease sufficiently. Even in the case where the thickness of the boron-containing region 40 is greater than 10 nanometers, the contact resistance Rc does not decrease sufficiently.

The time of the plasma processing is long in the semiconductor devices 119b and 119c. The plasma processing is implemented as the cleaning as well. Therefore, a portion of the n-type semiconductor layer 10 is etched by the plasma processing in the semiconductor devices 119b and 119c.

In the semiconductor devices 119b and 119c of the reference examples as shown in FIG. 6C, FIG. 6D, FIG. 7C, and FIG. 7D, peaks corresponding to oxygen (O) and silicon (Si) are confirmed. The silicon that is detected is, for example, the silicon inside the n-type semiconductor layer 10.

Conversely, in the semiconductor devices 111a and 111f as shown in FIG. 6A, FIG. 6B, FIG. 7A, and FIG. 7B, peaks corresponding to silicon and oxygen substantially are not confirmed. The boron-containing region 40 is formed in the semiconductor devices 111a and 111f. Silicon inside the n-type semiconductor layer 10 substantially is not detected in the semiconductor devices 111a and 111f.

In the embodiment, the silicon concentration included in the boron-containing region 40 is, for example, 5 atomic % or less. It is favorable for the silicon concentration to be 2 atomic % or less, or 1.5 atomic % or less.

In the semiconductor device 111a, the silicon concentration that is detected is, for example, 0.19 atomic %. In the semiconductor device 111f, the silicon concentration that is detected is, for example, 1.32 atomic %.

In the semiconductor device 119b, the silicon concentration that is detected is, for example, 7.58 atomic %. In the semiconductor device 119c, the silicon concentration that is detected is, for example, 5.86 atomic %.

The silicon concentration of the boron-containing region 40 of the semiconductor device 111a is lower than the silicon concentration of the boron-containing region 40 of the semiconductor device 111f. It is considered that this is because silicon is removed by the cleaning.

In the embodiment, the ratio (Si/Ga) of the number of silicon (Si) atoms to the number of gallium (Ga) atoms in the boron-containing region 40 is, for example, not more than 20%. It is favorable for the ratio (Si/Ga) to be not more than 10%, or not more than 5%.

In the semiconductor device 111a, Si/Ga is, for example, 0.5%. In the semiconductor device 111f, Si/Ga is, for example, 4.06%.

In the semiconductor device 119b, Si/Ga is, for example, 30.1%. In the semiconductor device 119c, Si/Ga is, for example, 23.1%.

As shown in FIG. 5A and FIG. 5B, the chlorine (Cl) concentration of the semiconductor device 111f is higher than the chlorine concentration of the semiconductor device 111a. It is considered that this is because chlorine is removed in the cleaning of the semiconductor device 111a.

In the semiconductor device 111a, the chlorine concentration of the surface of the boron-containing region 40 is low. Therefore, the adhesion between the first metal layer 41 and the boron-containing region 40 is good. The operating voltage is low in the semiconductor device 111a.

The contact resistance Rc of the semiconductor device 111a is, for example, not less than $8 \times 10^{-5}$ $\Omega cm^2$ and not more than $1 \times 10^{-4}$ $\Omega cm^2$. On the other hand, the semiconductor devices 119b and 119c of the reference examples have Schottky properties; and the contact resistance Rc is too high to evaluate.

The semiconductor devices will now be described further.

The semiconductor devices 112 and 113 and the semiconductor devices 119d and 119e of the reference examples will now be described.

In the semiconductor device 112, the first metal layer 41 includes platinum (Pt). In the semiconductor device 112, the plasma processing is implemented in a $BCl_3$/Ar atmosphere. In the semiconductor device 112, water rinsing is implemented after plasma processing. The time of the water rinsing is 10 minutes. Otherwise, the conditions are the same as those of the semiconductor device 111a.

In the semiconductor device 113, the first metal layer 41 includes nickel (Ni). Otherwise, the conditions are the same as those of the semiconductor device 112.

The heat treatment is not performed in the semiconductor devices 112 and 113.

In the semiconductor device 119d of the reference example, the plasma processing is implemented in a $Cl_2$/Ar atmosphere. In the semiconductor device 119d, the water rinsing is implemented after plasma processing. Otherwise, the conditions are the same as those of the semiconductor device 112.

Other than the first metal layer 41 including nickel (Ni), the semiconductor device 119e of the reference example is made using the same conditions as the semiconductor device 119d.

Examples of changing the Schottky barrier height (eV) before and after plasma processing in the semiconductor devices will now be described.

In the semiconductor device 112, the barrier height decreases, for example, 0.32 eV due to the plasma processing. In the semiconductor device 113, the barrier height decreases 0.12 eV due to the plasma processing. The drive voltage is low in the semiconductor devices 112 and 113.

On the other hand, the barrier height before and after plasma processing does not change in the semiconductor devices 119d and 119e of the reference examples. It is considered that the boron-containing region 40 is not formed in the semiconductor devices 119d and 119e.

Figure 8A:
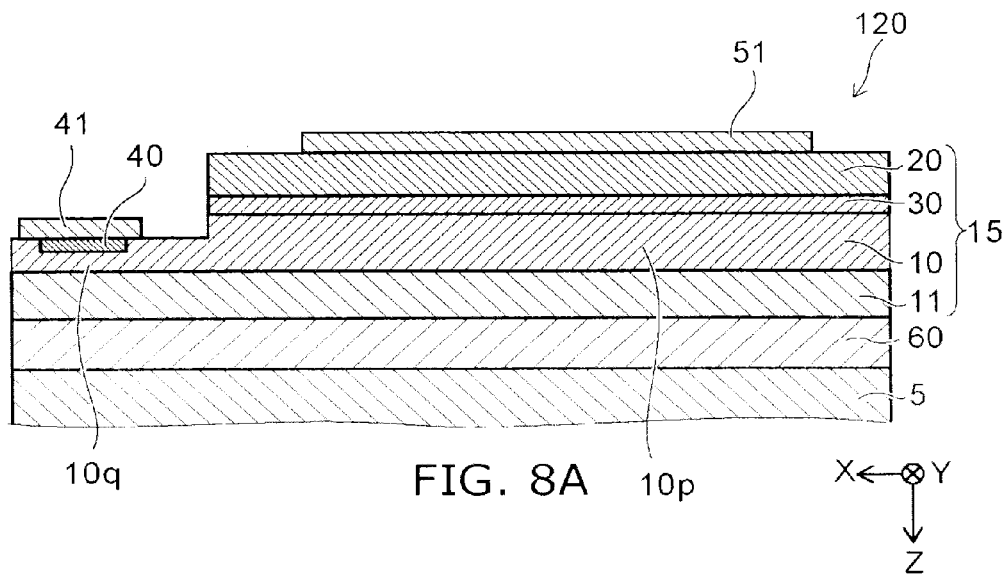
FIG. 8A and FIG. 8B are schematic cross-sectional views showing another semiconductor device according to the first embodiment.
Figure 8B:
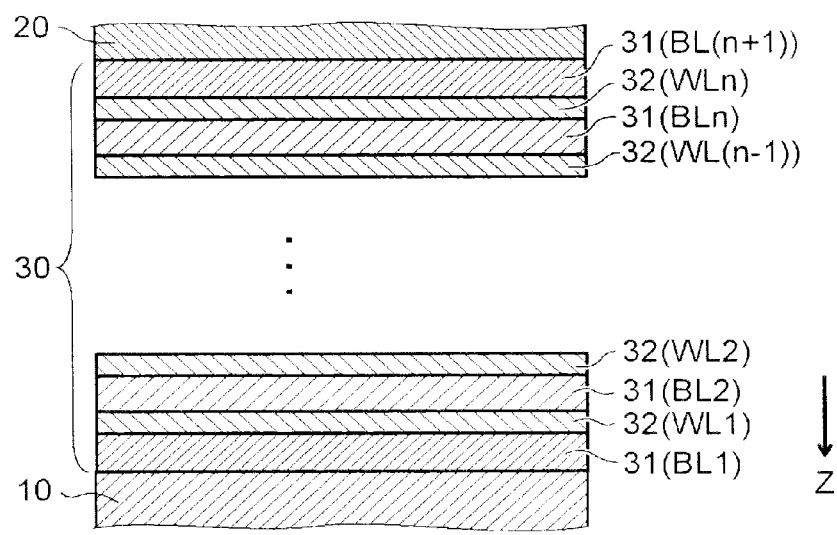

FIG. 8A and FIG. 8B are schematic cross-sectional views showing another semiconductor device according to the first embodiment.

FIG. 8A shows the semiconductor device 120. FIG. 8B shows an example of the light emitting layer 30.

As shown in FIG. 8A, the semiconductor device 120 according to the embodiment further includes a buffer layer 60 and a p-side electrode 51. In the example, the stacked body 15 includes the n-type semiconductor layer 10, a low impurity concentration layer 11, the light emitting layer 30, and the p-type semiconductor layer 20. Otherwise, the configuration of the semiconductor device 120 is the same as that of the semiconductor device 110. In the example, the semiconductor device 120 is a semiconductor light emitting element.

For example, the buffer layer 60 is provided between the growth substrate 5 and the n-type semiconductor layer 10. The buffer layer 60 may include multiple layers.

The buffer layer 60 includes, for example, an AlN buffer layer. The thickness of the AlN buffer layer is, for example, not less than 10 nanometers (nm) and not more than 400 nm. For example, the thickness of the AlN buffer layer is about 200 nm. The buffer layer 60 may include a GaN layer. In the case where the buffer layer 60 includes a GaN layer, the thickness of the GaN layer is, for example, not less than 10 nm and not more than 50 nm. The thickness of the GaN layer is, for example, about 30 nm.

A mixed crystal of AlGaN, InGaN, etc., may be used as the buffer layer 60.

For example, the low impurity concentration layer 11 is provided between the buffer layer 60 and the n-type semiconductor layer 10. The impurity concentration of the low impurity concentration layer 11 is lower than the impurity concentration of the n-type semiconductor layer 10.

For example, the p-type semiconductor layer 20 is provided between the p-side electrode 51 and the light emitting layer 30. The p-side electrode 51 is electrically connected to the p-type semiconductor layer 20. A current is supplied to the stacked body 15 via the first metal layer 41 and the p-side electrode 51; and light is emitted from the light emitting layer 30.

An example of the light emitting layer 30 will now be described.

As shown in FIG. 8B, the light emitting layer 30 includes multiple barrier layers 31, and a well layer 32 provided between the multiple barrier layers 31. For example, the multiple barrier layers 31 and the multiple well layers 32 are stacked alternately along the Z-axis.

The well layer 32 includes, for example, $In_{x1}Ga_{1-x1}N$ (0<x1<1). The barrier layer 31 includes, for example, GaN. In other words, the well layer 32 includes In; but the barrier layer 31 substantially does not include In. The bandgap energy of the barrier layer 31 is larger than the bandgap energy of the well layer 32.

The light emitting layer 30 may have a single quantum well (SQW) configuration. In such a case, the light emitting layer 30 includes two barrier layers 31, and the well layer 32 provided between the barrier layers 31. Or, the light emitting layer 30 may have a multi quantum well (MQW) configuration. In such a case, the light emitting layer 30 includes three or more barrier layers 31 and well layers 32 provided respectively in the spaces between the barrier layers 31.

In other words, the light emitting layer 30 includes n+1 barrier layers 31 and n well layers 32 (n being an integer not less than 8). The (i+1)th barrier layer BL(i+1) is disposed between the ith barrier layer BLi and the p-type semiconductor layer 20 (i being an integer not less than 1 and not more than n-1). The (i+1)th well layer WL(i+1) is disposed between the ith well layer WLi and the p-type semiconductor layer 20. The first barrier layer BL1 is provided between the n-type semiconductor layer 10 and the first well layer WL1.

The nth well layer WLn is provided between the nth barrier layer BLn and the (n+1)th barrier layer BL(n+1). The (n+1)th barrier layer BL(n+1) is provided between the nth well layer WLn and the p-type semiconductor layer 20.

The peak wavelength of the light (the emitted light) emitted from the light emitting layer 30 is, for example, not less than 360 nanometers (nm) and not more than 650 nm. However, the peak wavelength is arbitrary in the embodiment.

Figure 9:
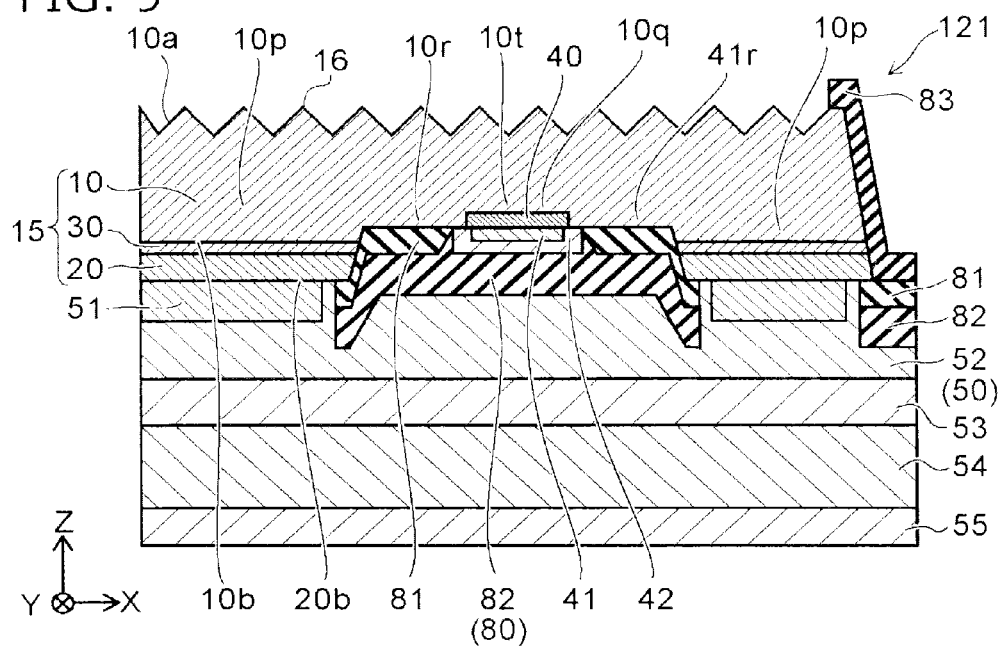
FIG. 9 is a schematic cross-sectional view showing the semiconductor device according to the first embodiment.
Figure 10:
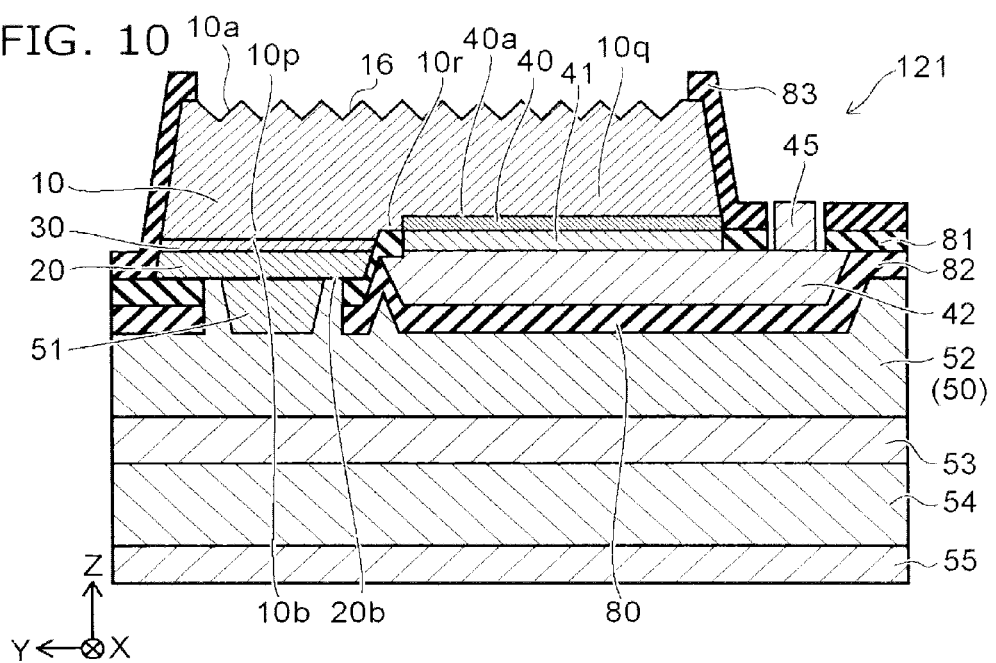
FIG. 10 is a schematic cross-sectional view showing the semiconductor device according to the first embodiment.

FIG. 9 and FIG. 10 are schematic cross-sectional views showing the semiconductor device according to the first embodiment.

Figure 11:
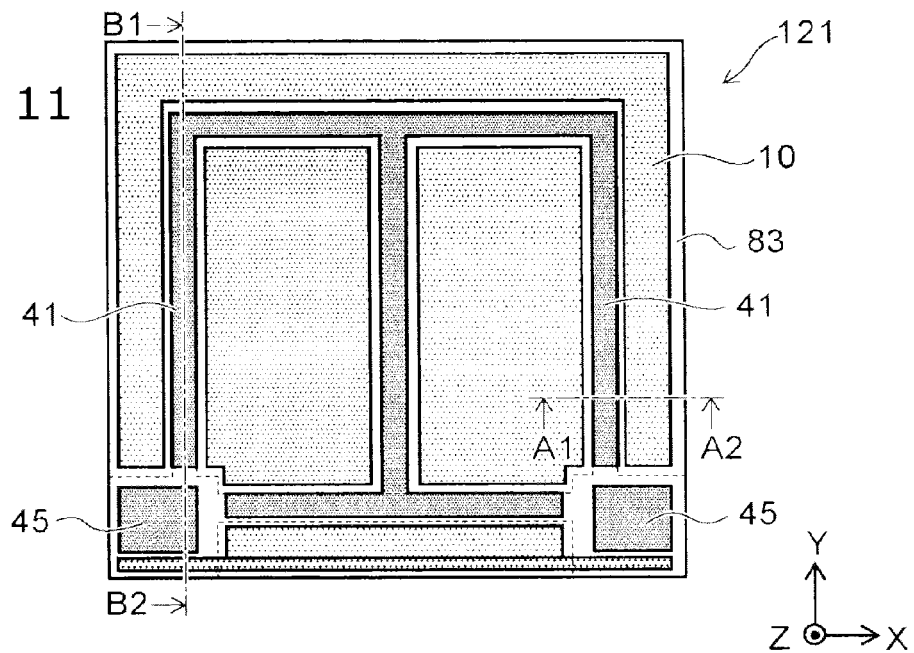
FIG. 11 is a schematic plan view showing the semiconductor device according to the first embodiment.

FIG. 11 is a schematic plan view showing the semiconductor device according to the first embodiment.

FIG. 9 is a cross-sectional view along line B1-B2 of FIG. 11. FIG. 10 is a cross-sectional view along line A1-A2 of FIG. 11.

As shown in FIG. 9 to FIG. 11, the semiconductor device 121 according to the embodiment further includes a second metal layer 42, a pad electrode 45, the p-side electrode 51, a back surface electrode 55, a support substrate 54, a bonding layer 53, a bonding metal unit 52 (an opposing conductive layer 50), an insulating layer 80, a first dielectric layer 81, a second dielectric layer 82, and a third dielectric layer 83. Otherwise, the configuration of the semiconductor device 121 is the same as that of the semiconductor device 110.

The semiconductor device 121 is a semiconductor light emitting element.

The first metal layer 41 and the second metal layer 42 are patterned into band configurations in the semiconductor device 121. The first metal layer 41 is used as a fine wire electrode that spreads the current inside the element surface. The second metal layer 42 is electrically connected to the first metal layer 41 and the pad electrode 45.

In the semiconductor device 121, the n-type semiconductor layer 10 further includes, for example, a third portion 10r. The third portion 10r is provided between the first portion 10p and the second portion 10q in a direction perpendicular to the stacking direction.

The support substrate 54 is provided between the back surface electrode 55 and the n-type semiconductor layer 10. The bonding layer 53 is provided between the support substrate 54 and the n-type semiconductor layer 10. The bonding metal unit 52 is provided between the bonding layer 53 and the n-type semiconductor layer 10. At least a portion of the bonding metal unit 52 is used to form the opposing conductive layer 50.

The p-side electrode 51 is provided between the bonding metal unit 52 and the first portion 10p of the n-type semiconductor layer 10. The p-type semiconductor layer 20 is provided between the p-side electrode 51 and the first portion 10p of the n-type semiconductor layer 10. The second dielectric layer 82 is provided between the bonding metal unit 52 and the second portion 10q of the n-type semiconductor layer 10. At least a portion of the second dielectric layer 82 is used to form the insulating layer 80.

The second metal layer 42 is provided between the second dielectric layer 82 and the second portion 10q of the n-type semiconductor layer 10. The first metal layer 41 is provided between the second metal layer 42 and the second portion 10q of the n-type semiconductor layer 10. The second metal layer 42 covers the first metal layer 41. The second dielectric layer 82 covers the side surface of the second metal layer 42.

The second dielectric layer 82 extends between the bonding metal unit 52 and the third portion 10r of the n-type semiconductor layer 10. The first dielectric layer 81 is provided between the second dielectric layer 82 and the second portion 10q of the n-type semiconductor layer 10.

In the example, an unevenness 16 is provided in the first major surface 10a. The unevenness 16 changes the travel direction of the light. The depth (the height) of the unevenness 16 is not less than 0.5 times and not more than 5 times the wavelength (the peak wavelength) of the light emitted from the light emitting layer 30.

The pad electrode 45 is provided to be separated from the bonding metal unit 52. The second dielectric layer 82 extends between the bonding metal unit 52 and the pad electrode 45. The pad electrode 45 is electrically connected to the second metal layer 42. The third dielectric layer 82 is provided on the side surface of the n-type semiconductor layer 10.

An example of a method for manufacturing such a semiconductor device 121 will now be described.

For example, the stacked body 15 is formed similarly to the semiconductor device 111. The stacked body 15 has, for example, a p-side surface 20b. The p-side surface 20b is the surface of the stacked body 15 on the p-type semiconductor layer 20 side.

A portion of the p-type semiconductor layer 20 and a portion of the light emitting layer 30 are removed by dry etching, etc. Thereby, a recess 10t is formed. A portion of the n-type semiconductor layer 10 is exposed at the recess 10t. As described below, the first metal layer 41 and the second metal layer 42 are formed at the recess 10t. The recess 10t has, for example, a trench configuration having a width of about 25 μm. When making the recess 10t, a pad recess (not shown) is made at the position where the pad electrode 45 described below is formed. The pad recess is, for example, a quadrilateral having one side that is about 130 μm long.

A $SiO_2$ layer that is used to form the first dielectric layer 81 is formed on the p-side surface 20b. The thickness of the first dielectric layer 81 is about 400 nm.

The portion of the first dielectric layer 81 inside the recess 10t is removed by etching along the configuration of the recess 10t. The width of the first dielectric layer 81 that is removed is, for example, about 25 μm. The n-type semiconductor layer 10 is exposed where the first dielectric layer 81 is removed.

The boron-containing region 40 is formed in the n-type semiconductor layer 10 that is exposed. The first metal layer 41 is formed on the n-type semiconductor layer 10 where the boron-containing region 40 is formed. The formation of the boron-containing region 40 and the first metal layer 41 may include the methods described above. Heat treatment may be performed after the formation of the first metal layer 41. The heat treatment may include the methods described above.

A stacked film of Ti/Pt/Au/Ti that is used to form the second metal layer 42 is formed on the first metal layer 41 and the first dielectric layer 81. The thickness of the stacked film of Ti/Pt/Au/Ti is, for example, about 700 nm. The formation of the stacked film of Ti/Pt/Au/Ti includes, for example, lift-off, etc.

A $SiO_2$ layer that is used to form the second dielectric layer 82 is formed on the p-side surface 20b. The thickness of the second dielectric layer 82 is about 600 nm. The formation of the second dielectric layer 82 is performed at 350° C. or more. Thereby, high insulative properties are obtained. The formation of the second dielectric layer 82 includes, for example, CVD. Thereby, good coverage is obtained.

A portion of the first dielectric layer 81 and a portion of the second dielectric layer 82 that are on the p-type semiconductor layer 20 are removed by wet etching, etc. A Ag film is formed to have a thickness of 200 nm on the p-type semiconductor layer 20 that is exposed by the wet etching, etc. The p-side electrode 51 is formed by sintering for about 1 minute in an oxygen atmosphere at a temperature of 400° C.

For example, a stacked film of Ti/Pt/Au that is used to form the bonding metal unit 52 is formed on the entire p-side surface 20b. The thickness of the stacked film of Ti/Pt/Au is, for example, about 800 nm.

The support substrate 54 includes, for example, a silicon substrate. The bonding layer 53 is provided on the major surface of the support substrate 54. The bonding layer 53 includes, for example, solder including a AuSn alloy. The thickness of the bonding layer 53 is, for example, about 3 μm.

The bonding metal unit 52 and the bonding layer 53 are caused to oppose each other and are heated. The temperature of the heating is, for example, 300° C. The temperature is not less than the eutectic point of the solder. Thereby, the support substrate 54 and the stacked body 15 are bonded.

For example, laser light is irradiated onto the stacked body 15 from the growth substrate 5 side. The laser light includes, for example, the third harmonic (355 nm) or the fourth harmonic (266 nm) of a YVO$_4$ solid-state laser. Thereby, the GaN that is included in the stacked body 15 at the interface vicinity between the growth substrate 5 and the stacked body 15 is decomposed. Ga and N are produced from the GaN. For example, the decomposed Ga is removed by hydrochloric acid treatment, etc.; and the growth substrate 5 is peeled from the stacked body 15. Thereby, the growth substrate 5 and the stacked body 15 are separated.

The n-type semiconductor layer 10 is exposed by performing dry etching of the entire stacked body 15. At this time, the etching amount is adjusted so that, for example, the thickness of the n-type semiconductor layer 10 is 4 μm.

A portion of the stacked body 15 is removed by dry etching using a resist mask or a dielectric mask. A portion of the first dielectric layer 81 that contacts the stacked body 15 is exposed. The exposed region includes a region overlapping the second metal layer 42 for connecting to the pad electrode 45.

A SiO$_2$ layer that is used to form the third dielectric layer 83 is formed on the stacked body 15 and the exposed first dielectric layer 81. An opening is made in a portion of the SiO$_2$ layer. Thereby, the third dielectric layer 83 is formed. The thickness of the third dielectric layer 83 is, for example, about 600 nm. The surface of a portion of the n-type semiconductor layer 10 is exposed from the opening of the third dielectric layer 83.

The unevenness 16 is formed in the surface of the n-type semiconductor layer 10 using the third dielectric layer 83 having the opening as a mask. The formation includes, for example, patterning by alkaline etching using a KOH solution. In the etching, for example, a 1 mol/L KOH solution is used; the processing temperature is 80° C.; and the processing time is about 20 minutes.

The third dielectric layer 83 and the first dielectric layer 81 that are on the second metal layer 42 are removed by wet etching, etc. For example, a stacked film of Ti/Pt/Au that is used to form the pad electrode 45 is formed on the second metal layer 42 that is exposed. The thickness of the stacked film of Ti/Pt/Au is, for example, about 500 nm. For example, a bonding wire is connected to the pad electrode 45. Or, a conductive ball for connecting, etc., may be connected.

For example, the support substrate 54 is cut away by polishing, etc. The thickness of the support substrate 54 is set to be, for example, about 100 μm. For example, a stacked film of Ti/Pt/Au is formed as the back surface electrode 55 on the surface that is cut away. The thickness of the stacked film of Ti/Pt/Au is, for example, 800 nm. The back surface electrode 55 is connected to, for example, a heat sink and/or a package.

The support substrate 54 is cut as necessary by cleavage, a diamond blade, etc. Thereby, the semiconductor device 121 is completed.

The operating voltage of the semiconductor device 121 is low.

Figure 12:
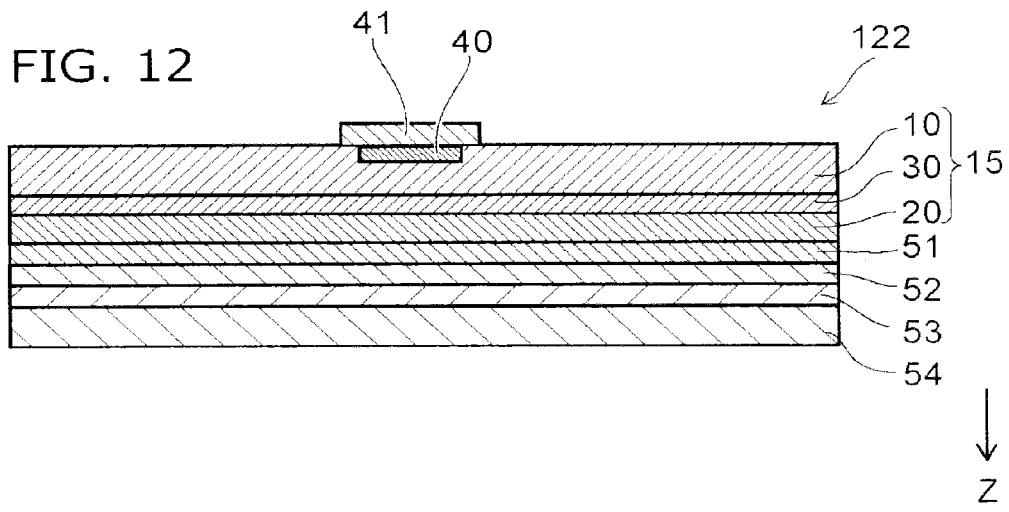
FIG. 12 is a schematic cross-sectional view showing another semiconductor device according to the first embodiment.

FIG. 12 is a schematic cross-sectional view illustrating another semiconductor device according to the first embodiment.

As shown in FIG. 12, the p-side electrode 51, the bonding metal unit 52, the bonding layer 53, and the support substrate 54 are provided in the semiconductor device 122 according to the embodiment as well. Otherwise, the configuration of the semiconductor device 122 is the same as that of the semiconductor device 110.

The semiconductor device 122 is a semiconductor light emitting element.

The operating voltage of the semiconductor device 122 is low.

Figure 13:
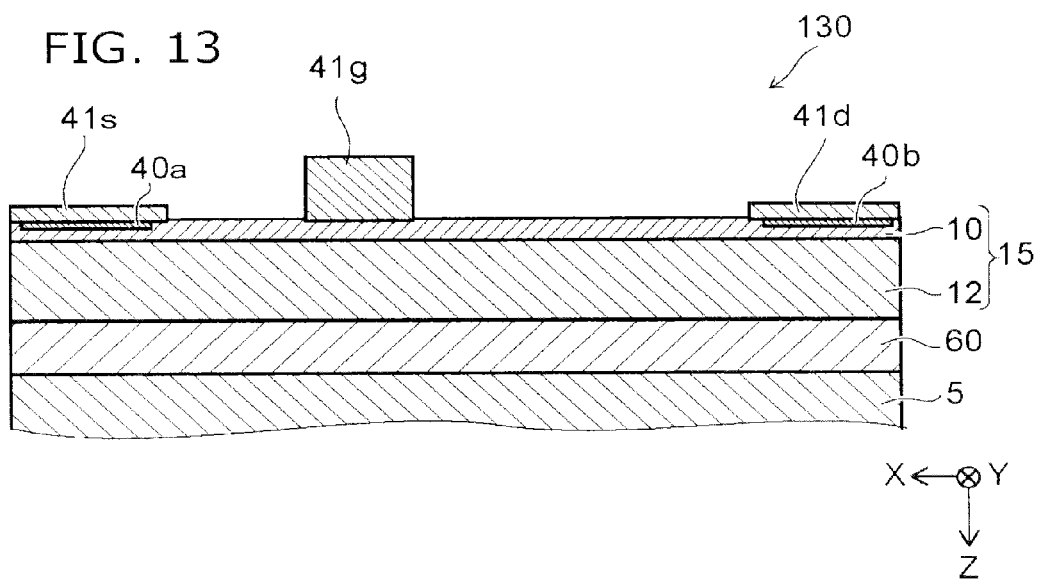
FIG. 13 is a schematic cross-sectional view showing another semiconductor device according to the first embodiment.

FIG. 13 is a schematic cross-sectional view showing another semiconductor device according to the first embodiment.

As shown in FIG. 13, the semiconductor device 130 according to the embodiment is a HEMT (High Electron Mobility Transistor) element. The n-type semiconductor layer 10 and a nitride semiconductor layer 12 are provided as the stacked body 15 in the semiconductor device 130. The first metal layer 41 includes, for example, a source electrode 41s (a source electrode portion) and a drain electrode 41d (a drain electrode portion).

In the example, the boron-containing region 40 includes a first region 40a and a second region 40b. For example, the second region 40b is separated from the first region 40a.

For example, the source electrode 41s contacts the first region 40a. For example, the drain electrode 41d contacts the second region.

The semiconductor device 130 further includes a gate electrode 41g. For example, the gate electrode 41g is disposed between the source electrode 41s and the drain electrode 41d.

For example, the nitride semiconductor layer 12 is provided between the n-type semiconductor layer 10 and the growth substrate 5. The nitride semiconductor layer 12 includes, for example, undoped Al$_\alpha$Ga$_{1-\alpha}$N (0≤α≤1) not including an impurity. The n-type semiconductor layer 10 includes, for example, n-type Al$_\beta$Ga$_{1-\beta}$N (0≤β≤1 and α<β). For example, the nitride semiconductor layer 12 includes an undoped GaN layer; and the n-type semiconductor layer 10 includes an n-type AlGaN layer.

The gate electrode 41g, the source electrode 41s, and the drain electrode 41d are provided on the n-type semiconductor layer 10. The source electrode 41s is separated from the drain electrode 41d inside the X-Y plane. The source electrode 41s and the drain electrode 41d have ohmic contacts with the n-type semiconductor layer 10. The gate electrode 41g is disposed on the n-type semiconductor layer 10 between the source electrode 41s and the drain electrode 41d. The gate electrode 41g has a Schottky contact with the n-type semiconductor layer 10.

In the semiconductor device 130, the boron-containing regions 40 are provided between the source electrode 41s and the n-type semiconductor layer 10 and between the drain electrode 41d and the n-type semiconductor layer 10.

In the example, the semiconductor device 130 further includes the buffer layer 60. For example, the buffer layer 60 is provided between the growth substrate 5 and the stacked body 15.

The operating voltage of the semiconductor device 130 is low.

Second Embodiment

The embodiment relates to a method for manufacturing the semiconductor device. For example, the methods for manufacturing the semiconductor devices 111, 111a to 111f, 113, and 121, etc., described above are applicable to the manufacturing method of the embodiment.

Figure 14:
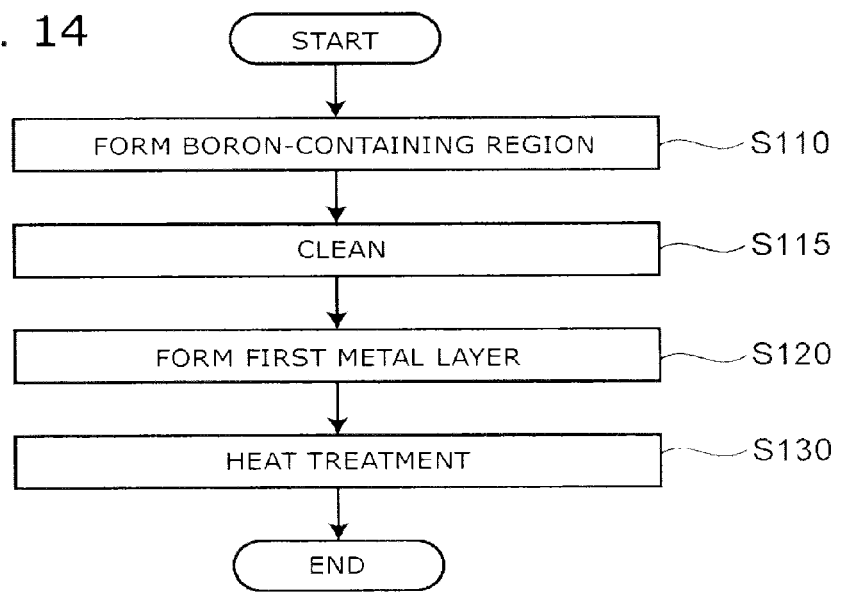
FIG. 14 is a flowchart showing the method for manufacturing the semiconductor device according to the second embodiment.

FIG. 14 is a flowchart illustrating the method for manufacturing the semiconductor device according to the second embodiment.

The method for manufacturing the semiconductor device according to the embodiment includes a process of forming the boron-containing region 40 in the n-type semiconductor layer 10 including a nitride semiconductor (step S110) and a process of forming the first metal layer 41 on the boron-containing region 40 (step S120).

In the process of forming the boron-containing region 40 (step S110), for example, plasma processing of the n-type semiconductor layer 10 is performed inside an atmosphere including $BCl_3$ gas. Thereby, the boron-containing region 40 that includes boron bonded to oxygen is formed in the n-type semiconductor layer 10.

The manufacturing method according to the embodiment further includes a cleaning process of, for example, cleaning the n-type semiconductor layer 10 with a cleansing agent including oxygen (step S115). The cleaning process (step S115) is implemented, for example, after the process of plasma processing (step S110) and prior to the process of forming the first metal layer (step S120). The cleansing agent includes, for example, water. The time of the cleaning is, for example, 10 minutes or more.

In the example, a process of heat treatment of the n-type semiconductor layer 10 and the first metal layer 41 in an inert gas atmosphere or at reduced pressure (step S130) is further included after the process of forming the first metal layer 41.

The temperature of the heat treatment is not less than 300° C. and not more than 650° C. The inert gas atmosphere includes, for example, nitrogen or argon. The time of the heat treatment is, for example, not less than 30 seconds and not more than 5 minutes.

According to the manufacturing method according to the embodiment, a method for manufacturing a semiconductor device having a low operating voltage can be provided.

According to the embodiments, a semiconductor device and a method for manufacturing the semiconductor device having a low operating voltage can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the semiconductor device such as the n-type semiconductor layer, the first metal layer, the p-type semiconductor layer, the light emitting layer, the second metal layer, the insulating layer, the opposing conductive layer, etc., from known art; and such practice is within the scope of the invention to the extent that similar effects can be obtained.

Further, any two or more components of the specific examples may be combined within the extent of technical feasibility and are within the scope of the invention to the extent that the spirit of the invention is included.

Moreover, all semiconductor devices and methods for manufacturing semiconductor devices practicable by an appropriate design modification by one skilled in the art based on the semiconductor devices and the methods for manufacturing the semiconductor devices described above as embodiments of the invention also are within the scope of the invention to the extent that the spirit of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   an n-type semiconductor layer including a nitride semiconductor, the n-type semiconductor layer including a boron-containing region including boron bonded to oxygen; and
   a first metal layer contacting the boron-containing region.

2. The device according to claim 1, wherein a boron concentration of the boron-containing region is 0.4 atomic % or more.

3. The device according to claim 1, wherein a silicon concentration of the boron-containing region is 5 atomic % or less.

4. The device according to claim 1, wherein
   the n-type semiconductor layer is GaN including silicon, and
   a ratio of a number of Si atoms to a number of Ga atoms in the boron-containing region is not more than 20%.

5. The device according to claim 1, wherein a thickness of the boron-containing region along a stacking direction from the first metal layer toward the n-type semiconductor layer is not less than 0.1 nanometers and not more than 10 nanometers.

6. The device according to claim 1, further comprising:
   a p-type semiconductor layer including a nitride semiconductor; and
   a light emitting layer provided between the n-type semiconductor layer and the p-type semiconductor layer.

7. The device according to claim 1, further comprising a gate electrode,
   the boron-containing region including a first region and a second region, the second region being separated from the first region,
   the first metal layer including a source electrode portion and a drain electrode portion, the source electrode portion contacting the first region, the drain electrode portion contacting the second region, the gate electrode being disposed between the source electrode portion and the drain electrode portion.

8. The device according to claim 1, wherein the first metal layer includes Al.

9. The device according to claim 1, wherein the first metal layer includes at least one selected from Ti, Zn, and Ag.

10. A method for manufacturing a semiconductor device, comprising:

forming a boron-containing region in an n-type semiconductor layer including a nitride semiconductor by performing plasma processing of the n-type semiconductor layer in an atmosphere including $BCl_3$ gas, the boron-containing region including boron bonded to oxygen; and forming a first metal layer on the boron-containing region to contact the boron-containing region.

11. The method according to claim 10, wherein the atmosphere further includes Ar gas.

12. The method according to claim 11, wherein a ratio of a flow rate of the $BCl_3$ gas to a flow rate of the Ar gas is 0.2 or more.

13. The method according to claim 10, wherein a processing time of the plasma processing is 1 minute or less.

14. The method according to claim 10, further comprising cleaning the n-type semiconductor layer with a cleansing agent including oxygen after the plasma processing and prior to the forming of the first metal layer.

15. The method according to claim 14, wherein the cleansing agent includes water.

16. The method according to claim 14, wherein time of the cleaning is 5 minutes or more.

17. The method according to claim 10, further comprising performing, after the forming of the first metal layer, heat treatment of the n-type semiconductor layer and the first metal layer in an inert gas atmosphere and/or at reduced pressure.

18. The method according to claim 17, wherein a temperature of the heat treatment is not less than 300° C. and not more than 900° C.

19. The method according to claim 17, wherein the inert gas atmosphere includes at least one selected from nitrogen and argon.

20. The method according to claim 17, wherein a time of the heat treatment is 30 seconds or more.

* * * * *